US012796162B2

(12) United States Patent
Leduc

(10) Patent No.: US 12,796,162 B2
(45) Date of Patent: Nov. 10, 2026

(54) HIGH CONCENTRATION PHOTOVOLTAIC-THERMAL MODULES AND ASSOCIATED COMPONENTRY FOR COMBINED HEAT AND POWER SOLAR SYSTEMS

(71) Applicants: C.K. Howard Sales Agency Ltd., Sudbury (CA); 1930106 Ontario Limited, Sudbury (CA)

(72) Inventor: Gilles Leduc, Sudbury (CA)

(73) Assignees: C.K. Howard Sales Agency Ltd, Ontario (CA); 1930106 Ontario Limited, Ontario (CA)

( * ) Notice: Subject to any disclaimer, the term of this patent is extended or adjusted under 35 U.S.C. 154(b) by 329 days.

(21) Appl. No.: 18/551,943

(22) PCT Filed: Mar. 30, 2022

(86) PCT No.: PCT/CA2022/050480
§ 371 (c)(1),
(2) Date: Sep. 22, 2023

(87) PCT Pub. No.: WO2022/246535
PCT Pub. Date: Dec. 1, 2022

(65) Prior Publication Data
US 2024/0170597 A1 May 23, 2024

Related U.S. Application Data

(60) Provisional application No. 63/192,386, filed on May 24, 2021.

(51) Int. Cl.
*H10F 77/67* (2025.01)
*F24S 20/20* (2018.01)
(Continued)

(52) U.S. Cl.
CPC .............. *H10F 77/67* (2025.01); *F24S 20/20* (2018.05); *F24S 23/71* (2018.05); *F24S 23/75* (2018.05); *H10F 77/488* (2025.01)

(58) Field of Classification Search
CPC ....... H02S 40/22; H02S 40/345; Y02E 10/52; Y02E 10/60; H10F 77/488
See application file for complete search history.

(56) References Cited

U.S. PATENT DOCUMENTS

| | | | | |
|---|---|---|---|---|
| 4,086,485 A * | 4/1978 | Kaplow | H02S 20/30 136/246 |
| 4,187,123 A * | 2/1980 | Diggs | H10F 77/488 136/246 |

(Continued)

FOREIGN PATENT DOCUMENTS

| | | |
|---|---|---|
| DE | 202011100722 | 11/2011 |
| WO | 2006070425 | 7/2006 |

(Continued)

OTHER PUBLICATIONS

Okada et al."High Density Quantum Dot Solar Cells for Concentrating Photovoltaics (CPV)" Research Center for Advanced Science and Technology, The University of Tokyo, 978-1-5386-3917-7.

(Continued)

*Primary Examiner* — Jorge A Pereiro
(74) *Attorney, Agent, or Firm* — Ryan W Dupuis; Kyle R Satterthwaite; Ade & Company Inc.

(57) ABSTRACT

A high concentration photovoltaic-thermal (HCPV-T) module for electrical energy generation and thermal energy collection features a basin having a plurality of support protrusions upstanding from the basin floor, a plurality of light-concentrating optical assemblies, and an optical support tray seated atop the protrusions and holding the optical assemblies. Concentrated photovoltaic (CPV) power modules are aligned beneath the optical assemblies to receive
(Continued)

concentrated light therefrom. A heat exchange assembly routes a cooling fluid past each one of the CPV power modules. Each CPV power module has multiple CPV cells on a shared substrate, and a respective heat exchanger block has a flow channel that routes the cooling fluid serially past the multiple CPV cells. Each optical assembly features a quad concentrator having four compound paraboloid concentrators (CPCs) seamlessly integrated together via joining webs that collectively form a support flange for rested support of the quad concentrator atop a CPC holder.

20 Claims, 7 Drawing Sheets

(51) Int. Cl.
*F24S 23/71* (2018.01)
*F24S 23/75* (2018.01)
*H10F 77/42* (2025.01)

(56) References Cited

U.S. PATENT DOCUMENTS

| | | | | |
|---|---|---|---|---|
| 5,118,361 | A * | 6/1992 | Fraas | H10F 10/144 438/65 |
| 5,949,081 | A | 9/1999 | Ashley et al. | |
| 6,384,320 | B1 * | 5/2002 | Chen | F24S 23/80 136/246 |
| 8,467,124 | B2 * | 6/2013 | Thiel | F24S 23/71 136/246 |
| 9,231,140 | B2 * | 1/2016 | Vaid | H02S 40/22 |
| D792,341 | S * | 7/2017 | Delsaut | D13/102 |
| 9,739,991 | B2 * | 8/2017 | Delsaut | F24S 23/75 |
| 10,133,044 | B2 | 11/2018 | Amjad et al. | |
| 2006/0231133 | A1 * | 10/2006 | Fork | F24S 23/79 136/246 |
| 2006/0266408 | A1 * | 11/2006 | Horne | G02B 19/0042 136/246 |
| 2007/0215198 | A1 * | 9/2007 | Jiang | H10F 77/63 136/246 |
| 2007/0256726 | A1 * | 11/2007 | Fork | H10F 77/63 136/246 |
| 2009/0056790 | A1 * | 3/2009 | Tian | F24S 23/79 136/246 |
| 2009/0120499 | A1 * | 5/2009 | Prather | H10F 77/488 438/69 |
| 2009/0120500 | A1 * | 5/2009 | Prather | H10F 77/63 156/60 |
| 2009/0159125 | A1 * | 6/2009 | Prather | H10F 77/63 136/259 |
| 2009/0223555 | A1 * | 9/2009 | Ammar | H10F 77/484 136/246 |
| 2009/0301545 | A1 * | 12/2009 | Young | F24S 23/79 136/246 |
| 2010/0012171 | A1 * | 1/2010 | Ammar | H10F 77/63 136/246 |
| 2010/0126554 | A1 * | 5/2010 | Morgan | H02S 40/425 136/246 |
| 2010/0186820 | A1 * | 7/2010 | Schon | H02S 40/44 60/641.15 |
| 2011/0263067 | A1 * | 10/2011 | Vaid | H10F 77/484 257/E31.127 |
| 2012/0266940 | A1 | 10/2012 | Grant et al. | |
| 2012/0279554 | A1 | 11/2012 | Bostwick | |
| 2013/0087184 | A1 * | 4/2013 | Tran | H10F 77/488 136/246 |
| 2013/0319503 | A1 * | 12/2013 | Mantilla | H10F 77/935 136/246 |
| 2014/0182655 | A1 | 7/2014 | Caparros Jimenez et al. | |
| 2015/0244310 | A1 * | 8/2015 | Singer | H02S 20/32 136/246 |
| 2016/0004055 | A1 | 1/2016 | Delsaut et al. | |
| 2017/0108681 | A1 * | 4/2017 | Amjad | H02S 40/22 |

FOREIGN PATENT DOCUMENTS

| | | | | |
|---|---|---|---|---|
| WO | 2010138086 | | 12/2010 | |
| WO | WO-2011051510 | A1 * | 5/2011 | H10F 77/488 |
| WO | WO-2012017274 | A1 * | 2/2012 | H10F 77/484 |
| WO | WO-2015179981 | A1 * | 12/2015 | H02S 40/22 |

OTHER PUBLICATIONS

Mousis et al. "The Hera Saturn Entry Probe Mission", Planetary and Space Science 130 (2016) 80-103.
Proulx et al.,"Characterization of an Assembly Architecture Incorporating a Multi-Cell Design for lower Cost Hybrid CPV Modules", AIP Conference Proceedings vol. 1766. No. 1, AIP Publishing LLC 2016.
Emiliano Bellini."CPV Module with Triple-Junction Cells and Double-Bonded Copper Carriers." PV Magazine Jan. 25, 2021 https://www.pv-magazine.com/2021/01/25/cpv-module-with-triple-junction-cells-and-double-bonded-copper-carriers/.
Marc Montgomery,"Canadian Invention: Solar Panels Obsolete?", https://www.rcinet.ca/en/2016/05/09/canadian-invention-solar-panels-absolete/.

* cited by examiner

HIGH CONCENTRATION PHOTOVOLTAIC-THERMAL MODULES AND ASSOCIATED COMPONENTRY FOR COMBINED HEAT AND POWER SOLAR SYSTEMS

FIELD OF THE INVENTION

The present invention relates generally to solar energy and, more particularly, to design of high concentration photovoltaic-thermal (HCPV-T) solar collectors that use light-concentrating optics to concentrate sunlight onto small concentrated photovoltaic (CPV) cells to both generate electricity and collect thermal energy for combined heat and power (CHP) applications.

BACKGROUND

Among prior endeavours in the forgoing field of technology are the systems, modules and componentry disclosed in U.S. Utility Pat. Nos. 9,739,991 and 10,133,044 and US Design Patent USD792341, each of which shares at least one inventor with the present application, and all of which are incorporated herein by reference in their respective entirety.

In the earlier of the two prior utility patents, a particular design of a solar concentrating optical assembly was proposed, and a plurality of such assemblies were used in an arrayed fashion in an enclosure whose floor was lined with a serpentine heat exchanger having multiple linear runs, over each of which a respective row of the optical assemblies were disposed to concentrate sunlight onto a series of respective CPV cells mounted flat atop the heat exchanger run.

In the latter of the two prior utility patents, a very different novel style of light-concentrating optical assembly was proposed, each composed of a set of four primary off-axis quarter-section parabolic reflectors for receiving incident sunlight, a respective set of four secondary off-axis quarter-section parabolic reflectors for receiving reflected sunlight from the primary reflectors, and a respective set of four compound paraboloid concentrators (CPCs), also known as Winston Cones, for receiving and concentrating the reflected sunlight from the secondary reflectors for the purpose of thermal energy collection and photovoltaic power generation. Each optical assembly of this type can be referred to an as optical quad, in view of the four reflectors/concentrators in each of its optical component subsets.

The prior design patent disclosed a solar panel composed of nine optical quads laid out in a three-by-three array in an enclosure topped off with a transparent cover.

In "Characterization of an assembly architecture incorporating a multi-cell design for lower cost hybrid CPV modules", AIP Conference Proceedings 1766, 060003 (2016); the entirety of which is incorporated herein by reference, CPV modules were disclosed that combined the forgoing optical quads with quad receivers, each composed of respective set of four triple junction CPV cells mounted on a shared direct bonded copper (DBC) single alumina ceramic carrier in positions underlying the four CPCs of a respective optical quad, thus forming a CPV power module that generates electrical energy from the concentrated solar output of that respective optical quad. The CPV cells were individually protected by four by-pass diodes.

The present application builds upon the teachings of these prior reference in furtherance of the desired goal of highly efficient and cost effective HCPV-T solutions in the field of solar energy.

SUMMARY OF THE INVENTION

In no particular order, a plurality of novel and inventive aspects of the present invention are briefly summarized as follows.

According to a first aspect of the invention, there is provided a high concentration photovoltaic-thermal (HCPV-T) module for electrical energy generation and thermal energy collection using concentrated light, said module comprising:

a basin comprising a floor, a plurality of perimeter walls upstanding from said floor around a perimeter thereof to bound an interior space of the basin, wherein said floor has a varying elevational profile characterized by an arrayed plurality of raised floor protrusions organized in one or more rows in which said raised floor protrusions are spaced apart from one another across intervening lower floor regions that are situated between, and are of lesser elevation than, said raised floor protrusions, and from which said raised floor protrusions are upstanding from said floor within the interior space at spaced apart positions from one another in said one or more rows;

a plurality of light-concentrating optical assemblies;

an optical support tray seated in an installed position within the interior space of said basin, and comprising an array of optical support seats concavely recessed into a topside of said optical support tray and laid out in multiple rows in a grid pattern thereon for individual support of a respective one of said light-concentrating optical assemblies in each of said optical support seats;

a plurality of concentrated photovoltaic (CPV) power modules in equal quantity to said plurality of light-concentrating optical assemblies, with each of said CPV power modules residing in aligned relation beneath a respective one of said light concentrating optical assemblies to receive concentrated light therefrom to generate electrical power; and a heat exchange assembly installed within the interior space of the basin and configured for routing of a cooling fluid in heat-exchange relation past each one of the CPV power modules;

wherein at least one row of the raised floor protrusions reside between the multiple rows of the optical support seats in the optical support tray and said optical support tray is seated atop said at least one row of the protrusions of the basin at rest points of the optical support tray that reside at positions adjacent outer corners of said support seats and between said multiple rows of the grid pattern in which said optical support seats are laid out, and said optical support seats hang downwardly between the raised floor protrusions in spaces between the raised floor protrusions.

According to a second aspect of the invention, there is provided componentry for a high concentration photovoltaic-thermal (HCPV-T) module for electrical energy generation and thermal energy collection using concentrated light, said componentry including:

one or more multi-cell concentrated photovoltaic (CPV) power modules each having multiple CPV cells mounted on a shared substrate in discrete positions thereon for respective alignment thereof with a plurality of compound paraboloid concentrators (CPCs); and one or more heat exchanger blocks for respective use with said one or more multi-cell CPV power modules, each heat exchanger block having a predefined flow channel delimited therein through which the cooling fluid is routed serially on a non-linear path past a plurality of the multiple CPV cells of a respective one of the multi-cell CPV power modules in heat exchange relation therewith.

According to a third aspect of the invention, there is provided a heat exchanger component for cooling a multi-cell concentrated photovoltaic (CPV) power module having a plurality of CPV cells discretely laid out on a shared substrate, said heat exchanger component comprising:

a block having an inlet port and an outlet port through which cooling fluid is flowable into and out of said block;

a predefined flow channel in said block that fluidly interconnects said inlet and outlet ports on a non-linear path;

a wall of thermally conductive material that closes off said predefined flow channel in the block at a respective face thereof, whereby the cooling liquid flows through the channel in flowing contact with an interior side said thermally conductive wall;

wherein the non-linear path of the predefined flow channel passes serially by a plurality of discrete points that are distributed in spaced apart positions over an area of the wall of thermally conductive material and in matching layout to respective locations of the CPV cells on the shared substrate of the multi-cell CPV power module, and an exterior side of said thermally conductive wall is shaped and sized for seated mounting thereagainst of the shared substrate of the multi-cell CPV power module, whereby the cooling fluid routed through the predefined flow channel is in heat-exchange relationship with the multi-cell CPV power module, in a manner particularly targeting hot spots occupied by the CPV cells thereof, through the wall of thermally conductive material.

According to a fourth aspect of the invention, there is provided a high concentration photovoltaic-thermal (HCPV-T) module for electrical energy generation and thermal energy collection using concentrated light, said module comprising:

a support;

a plurality of light-concentrating optical assemblies installed on said support;

a plurality of concentrated photovoltaic (CPV) power modules in equal quantity to said plurality of light-concentrating optical assemblies, with each of said CPV power modules residing in aligned relation beneath a respective one of said light concentrating optical assemblies to receive concentrated light therefrom to generate electrical power; and a heat exchange assembly installed on said support and comprising:

a plurality of heat exchanger blocks in equal quantity to said plurality of CPV power modules, each heat exchanger block having an input port, and output port and a predefined flow channel extending therebetween for routing of cooling fluid from said input port to said output port via said flow channel, said flow channel being closed off at a respective face of the heat exchanger block by a wall of thermally conductive material, to an exterior of which is mounted the respective CPV power module, whereby the cooling fluid routed through the predefined flow channel is in heat-exchange relationship with the CPV power module through said wall of thermally conductive material; and a plurality of connection conduits connected to the inlet and outlet ports of the plurality of heat exchanger blocks to convey the cooling fluid to, from and between said plurality of heat exchanger blocks.

According to a fifth aspect of the invention, there is provided a multi-cone solar concentrator comprising:

a plurality of compound paraboloid concentrators (CPCs) each having a respective cone-like exterior wall delimiting a parabolically contoured interior that is of off-axis paraboloidal relationship to a respective central axis around which the cone-like exterior wall circumferentially spans;

wherein said plurality of CPCs are seamlessly integral components of a unitary structure in which said plurality of CPCs are integrally interconnected with one another by at least one of the following features:

(a) a plurality of joining webs of said unitary structure, each of which spans between a respective adjacent pair of CPCs and joins together said respective adjacent pair of CPCs through integral attachment to the exterior walls thereof at a discrete elevation thereon, while leaving said exterior walls of the adjacent pair of CPCs in spaced apart and unattached relation to one another at other elevations unoccupied by said joining web; and/or (b) direct and seamlessly integral interjoining of the exterior walls of each adjacent pair of CPCs to one another at upper regions thereof of more proximate relationship to wider inlet apertures of the parabolically contoured interiors of said adjacent pair of CPCs than to axially opposing and narrower exit apertures thereof, while leaving said exterior walls of the adjacent pair of CPCs in spaced apart and unattached relation to one another at other regions thereof.

BRIEF DESCRIPTION OF THE DRAWINGS

One embodiment of the invention will now be described in conjunction with the accompanying drawings in which.

DETAILED DESCRIPTION

Figure 1:
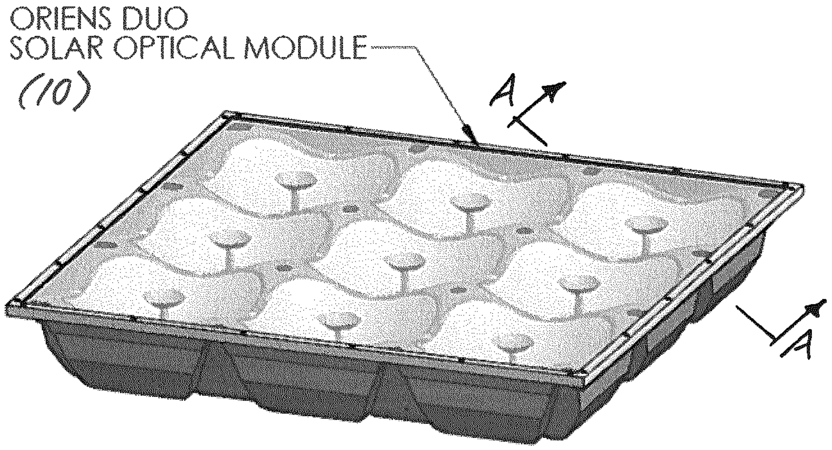
FIG. 1 is a fully assembled view of a HCPV-T solar collector module for use in CHP solar systems.
Figure 2:
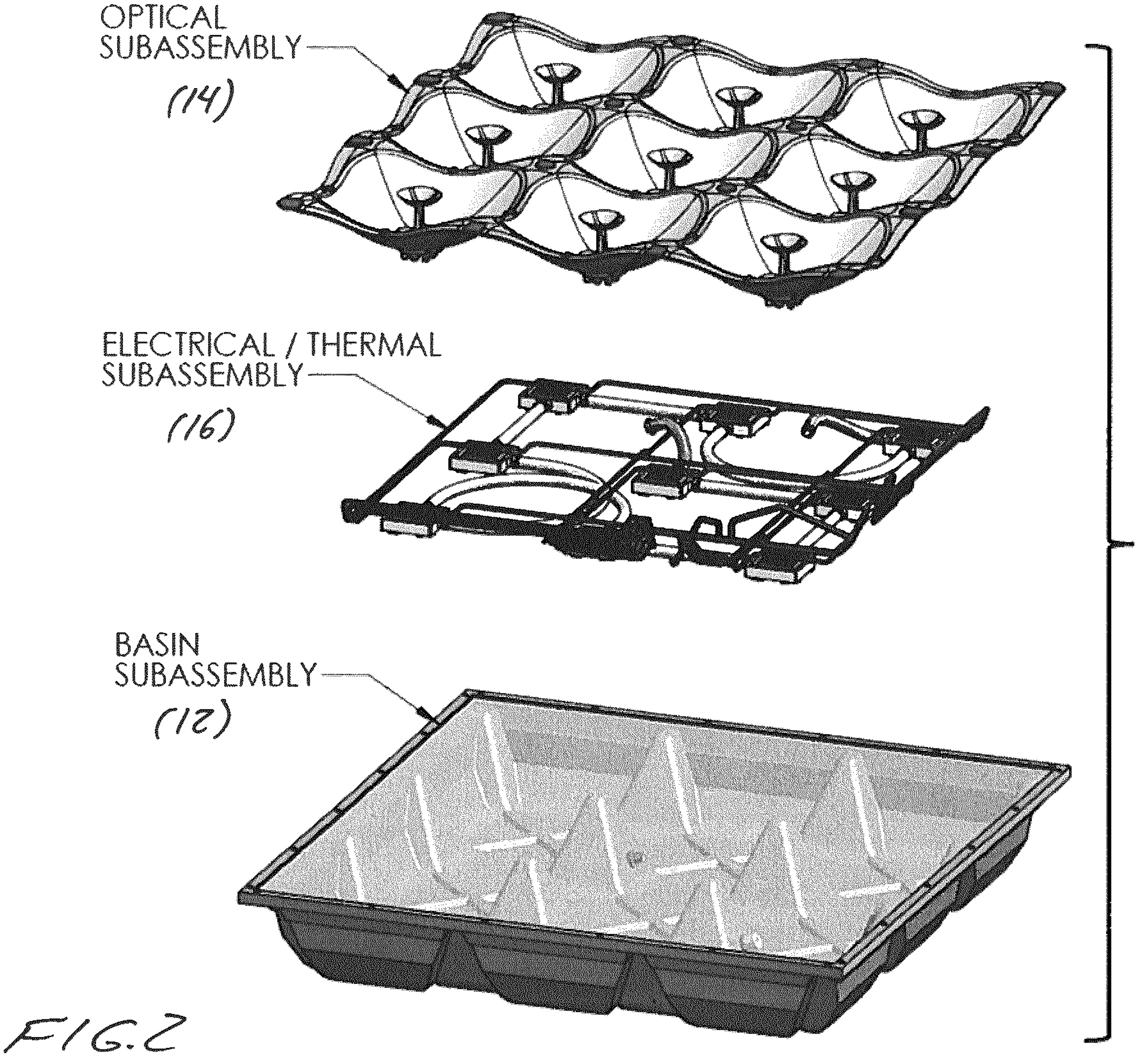
FIG. 2 is an exploded view of the HCPV-T solar collector module, illustrating separate optical, electrical/thermal and support basin subassemblies thereof.

FIG. 1 illustrates an assembled high concentration photovoltaic-thermal (HCPV-T) solar collector module 10 of the present invention, which is useful for electrical energy generation and thermal energy collection using concentrated sunlight. Referring to the exploded view of FIG. 2, the module is composed of a support basin subassembly 12 for holding and containing the other subassemblies, an optical subassembly 14 used to concentrated incident sunlight, and an electrical/thermal subassembly 16 to generate electricity from this concentrated sunlight and collect thermal energy therefrom.

The support basin subassembly 12 features a rectangular support basin 18 and a cooperating cover 20 that is composed of a rectangular sheet of transparent glass 22 (e.g. low-iron tempered glass) and a rectangular perimeter frame 24 that is fitted atop outer peripheral regions of the glass sheet 22 with an underlying perimeter seal 26. Through this arrangement, fastening of the perimeter frame 24 to the support basin 18 clamps the underlying glass 22 securely thereto to close off the initially open top of the support basin 18. The support basin 18 features a rectangular floor 28 from which a set of four perimeter walls 30 stand upright at the four respective sides of the rectangular floor 28. Top edges 30A of these perimeter walls cooperatively delimit the rectangular open top of the basin. A fastened state of the cover's perimeter frame 24 to the to edges 30A of the perimeter thus secures the cover glass 22 to the basin in a position fully spanning the open top thereof. In this closed state of the basin, an interior space thereof is delimited horizontally between the four perimeter walls 30, and vertically between the basin floor 28 and the cover glass 22. It will be appreciated that the direction terms "horizontal" and "vertical" are used in relation to the illustrated orientation of the module, where the basin floor resides in a horizontal reference plane from which the basin perimeter walls stand upright. This directionality is used only to describe relative orientation of different components and features in the drawings, and does not specifically denote an intended operating position or orientation of the HCPV-T module 10.

Instead of a flat floor 20, the basin 18 features a plurality of support protrusions 32A, 32B upstanding from the floor within the interior space of the basin 18 at spaced apart and uniformly arranged positions throughout the interior space thereof. In the illustrated embodiment, there are four freestanding protrusions 32A residing at inwardly spaced distances form the perimeter walls 30 of the basin 18. Additionally, the illustrated embodiment features four wall-attached corner protrusions 32B of directly attached relation to the basin's perimeter walls 30 at the basin corners where these perimeter walls 30 intersect, and eight wall-attached mid-wall protrusions 32C of directly attached relation to the basin's perimeter walls at central regions thereof between the basin's four corners. In the illustrated example, each perimeter wall 30 features two such mid-wall protrusions 32C.

In each of the two orthogonally related horizontal dimensions of the basin 18, each such dimension being measured across the basin floor 28 between a respective opposing pair of the basin's four perimeter walls 30, each mid-wall protrusion 32C on one of those two opposing perimeter walls 30 aligns with a corresponding mid-wall protrusion 32C on the other of those two opposing perimeter walls 30, and also aligns with two of the four freestanding protrusions 32A that are situated between those two opposing perimeter walls. These four aligned protrusions constitute a respective inner row of protrusions, of which there are two inner rows in each of the basin's two horizontal dimensions. In each of the basin's two horizontal dimensions, there are also two outer rows, each composed of the four wall-attached protrusions (two corner protrusions 32B, and two mid-wall protrusions 32C) on one of the two perimeter walls 30 running in that direction. So, in the illustrated example, there four rows of four protrusions each, in each of the basin's two horizontal dimensions. The rows are evenly spaced apart, the result of which is a four-by-four rectangular array of protrusions laid out in a grid pattern distributed uniformly throughout the rectangular footprint of the basin floor 28.

The freestanding protrusions 32A and mid-wall protrusions 32C are of upwardly tapered shape, growing narrower away from the basin floor 28 toward the open top of the basin 18. Being of three-dimensional freestanding form unattached to the perimeter walls, the freestanding protrusions 32A are tapered in both of the basin's horizontal dimensions, for example having a square-based pyramidal shape in the illustrated embodiment. The mid-wall protrusions 32C are upwardly tapered only in the horizontal dimension of the respective wall to which it is attached, thus having a more two-dimensional form resembling a triangular boss that juts a short distance inwardly from the respective perimeter wall 30. The corner protrusions 32B resemble small ribs that likewise jut a short distance inward from neighbouring areas of the two perimeter walls that intersect at the given corner of the basin 18. Each and every protrusion 32A-32C is slightly shorter than the perimeter walls 30, but equal in height to the other protrusions, whereby the top ends of the protrusions all reside in a common horizontal plane that is elevated off the horizontal floor 28 of the basin, and closer to the horizontal plane of the basin's open top, though at an elevation slightly therebelow in downwardly offset relation to the underside of the cover glass 22.

Figure 7:
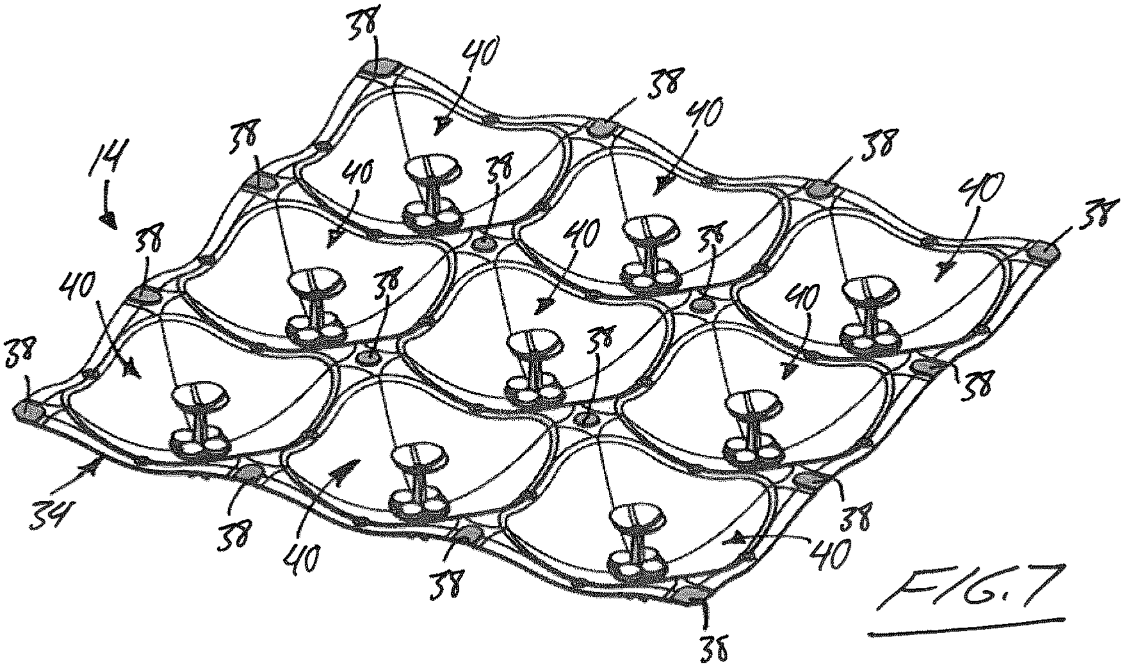
FIG. 7 is an isolated and assembled view of the optical subassembly of FIG. 2.
Figure 8:
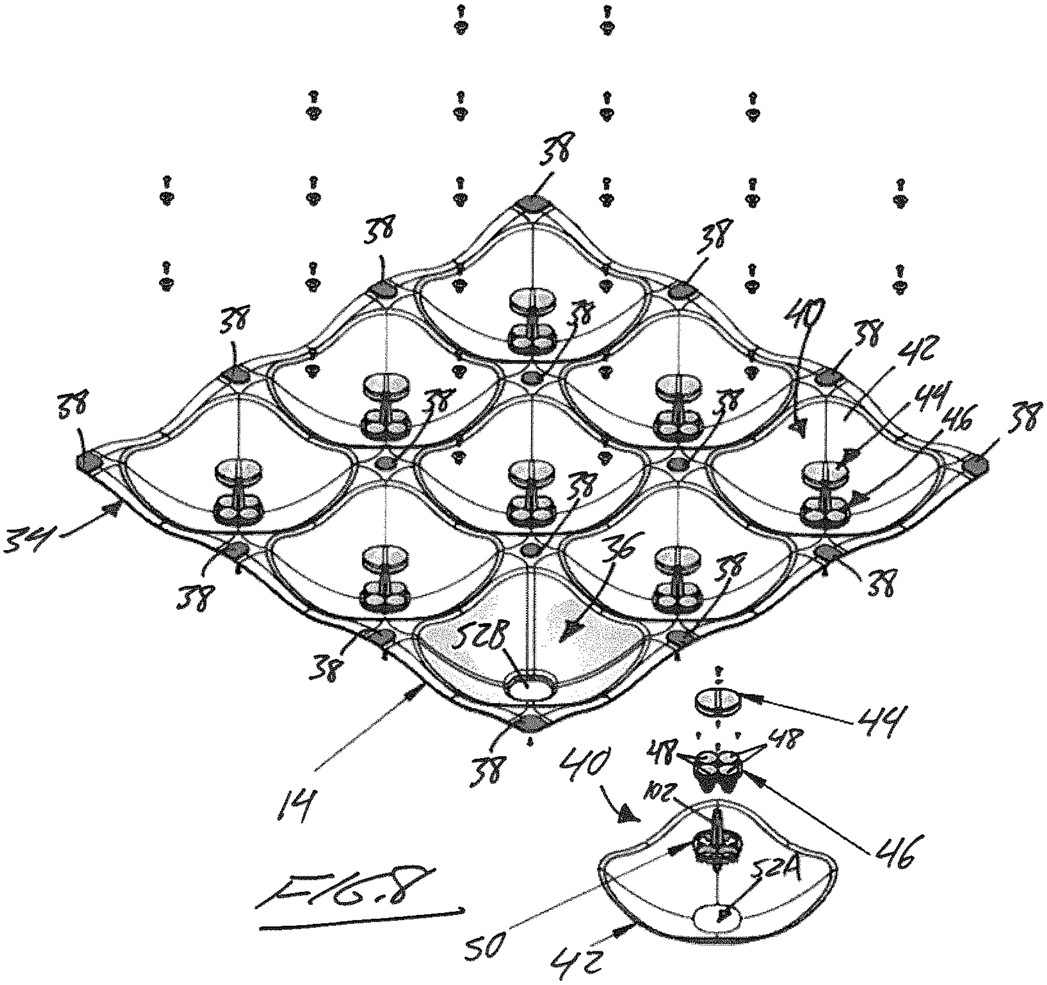
FIG. 8 is a partially exploded view of the optical subassembly of FIG. 7.

Referring to FIGS. 7 and 8, the optical subassembly 14 features an optical support tray 34 for placement in an installed position received within the interior space of the basin 18, and more specifically, seated on the top ends of the arrayed basin protrusions 32A-32C. The optical support tray 34 features an array of optical support seats 36, one of which is shown unoccupied in FIG. 8. Each optical support seat 36 is concavely recessed into a topside of the tray 34. The optical support seats 36 are laid out in a rectangular grid pattern on the support tray 34 for respective individual support of a respective light-concentrating optical assembly 40 in each optical support seat 36. In each of its two dimensions, the gridded rectangular array of support seats 36 in the optical support tray 34 is one row smaller than the gridded rectangular array of protrusions 32A-32C in the support basin 18. So, in the illustrated example with a four-by-four array of protrusions in the support basin 18, the optical tray features a three-by-three array of optical support seats 36, and the rows of optical support seats 36 are positioned specifically to reside between the rows of protrusions 32A-32C when the optical support tray 34 is seated thereatop. Each concavely recessed support seat 36 is thus neighboured at its four corners by a set of four respective rest points 38 of the tray 34. It is at these rest points 38 that the tray 34 rests atop a respective set of four basin protrusions 32A-32C in the tray's installed position. As a result, each support seat 36 hangs downwardly in the space between this respective set of four basin protrusions 32A-32C.

The optical subassembly 14 features an array of light-concentrating optical assemblies 40, each installed in a respective one of the optical support seats 36 of the optical support tray 34. As shown, each light concentrating optical assembly 40 (optical assembly, for short) may be of the type described in Applicant's presently incorporated U.S. Pat. No. 10,133,044. Accordingly, each optical assembly 40 in the illustrated embodiment comprises a primary quad mirror 42 composed of four primary quarter-section parabolic reflectors of off-axis and inwardly concave relation to a central vertical reference axis around which the primary quarter section reflectors are disposed to span collectively therearound and reflect incident sunlight theretoward, a secondary quad mirror 44 composed of four secondary quarter-section parabolic reflectors of off-axis and outwardly convex relation to the central vertical reference axis in elevated relation above the bottom of the primary quad mirror 42 to receive the reflected sunlight therefrom, and a quad concentrator 46 composed of four compound paraboloid concentrators (CPCs) 48 for receiving downwardly reflected light from the secondary quad mirror 44 and concentrating this reflected light for final concentrated emission of same from bottom outlet apertures of these CPCs 48.

Each optical assembly 40 further includes a CPC holder 50 designed to support both the quad concentrator 46 and the secondary quad mirror 44 via a central bottom opening 52A of the primary quad mirror 42 that is left open between the primary quarter-section parabolic reflectors at the central reference axis concavely faced thereby. The CPCs are also known in the art as Winston cones, and therefore also may be referred to herein as such. The Winston cone is described and illustrated in U.S. Pat. Nos. 3,923,381, 4,003,638 and 4,002,499, all of which are hereby incorporated by reference in their entirety, as is the publication by Ari Rabl titled "Comparison of Solar Concentrators", Solar Energy, Vol. 18, pp. 93-111.

Figure 5:
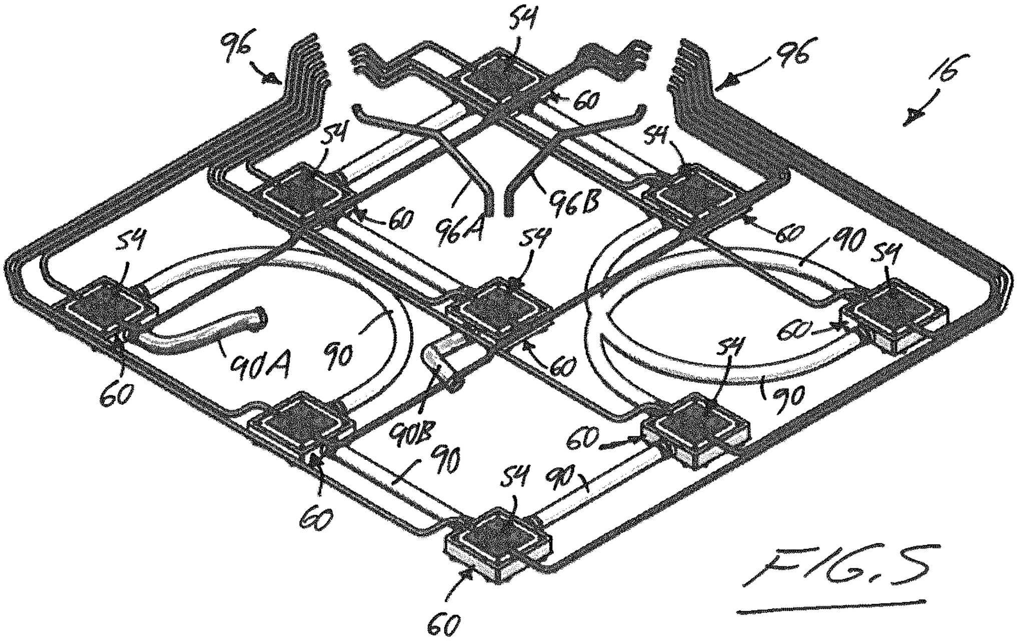
FIG. 5 is an isolated and assembled view of the electrical/thermal subassembly of FIG. 2.
Figure 6:
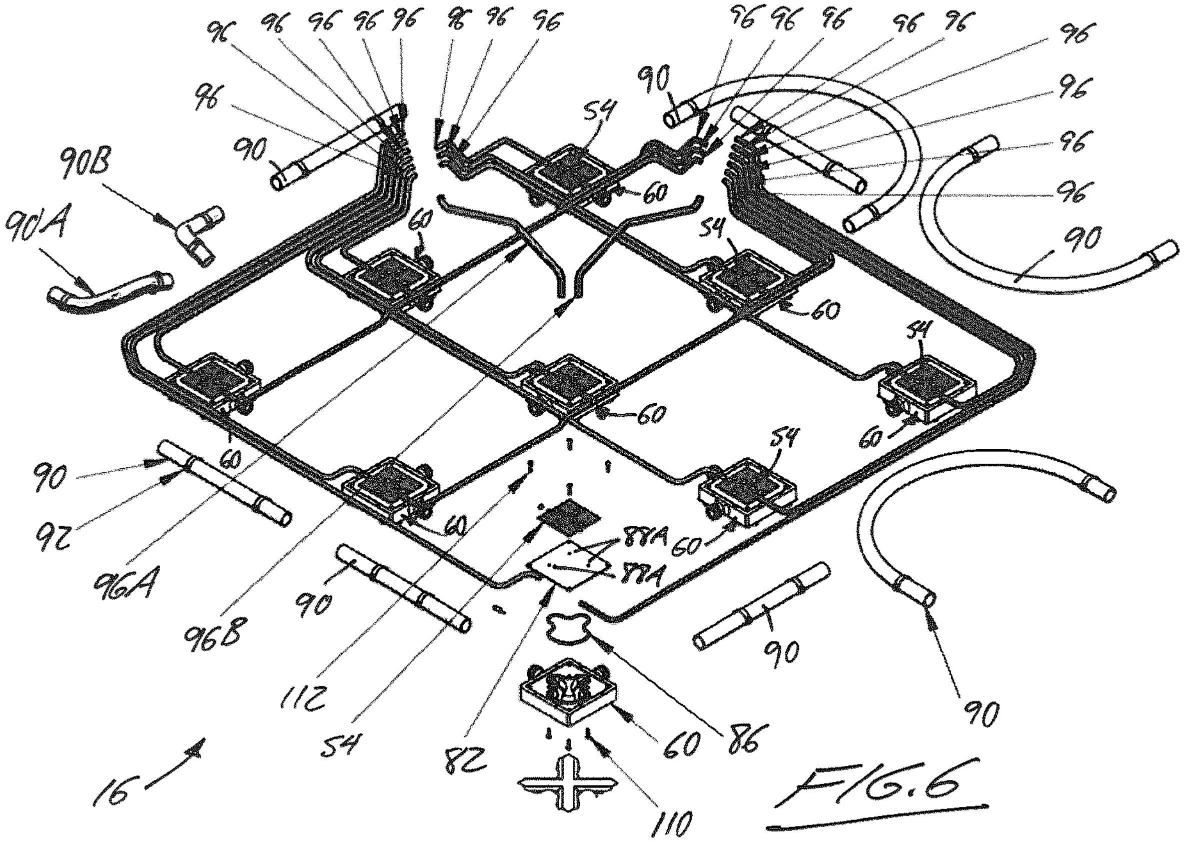
FIG. 6 is a partially exploded view of the electrical/thermal subassembly of FIG. 5.
Figure 15:
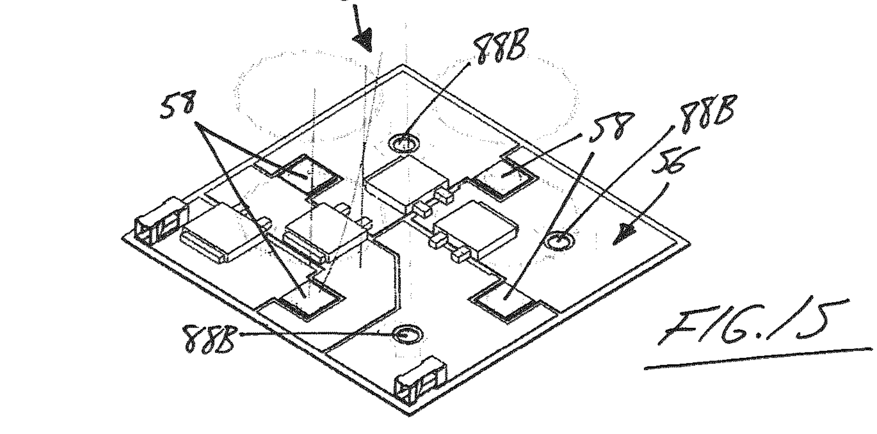
FIG. 15 is a top perspective view of the quad-cell CPV power module of FIG. 11 in isolation.

The electrical/thermal subassembly 16 is shown in FIGS. 5 and 6, and features an array of quad-cell CPV power modules 54 provided in equal quantity to the number of optical assemblies 40. In the assembled HCPV-T module 10, these quad-cell CPV power modules 54 reside in respectively aligned positions under the optical assemblies 40 within interior space of the basin 18 and, more specifically, beneath the installed optical support tray 34. Each quad-cell CPV power module 54, one of which is shown in isolation in FIG. 15, features a shared substrate or carrier 56 on which there are mounted four CPV cells 58, whose relative spacing to one another in the 2D plane of the substrate matches the relative spacing of the four exit apertures of the four CPCs 48 of the quad concentrator 46 in each of the optical assemblies 40. The layout and spacing is such that the four CPV cells 58 respectively reside at four corners of an imaginary square. The shared substrate 56 is also square in the illustrated example, but the smaller imaginary square whose corners are occupied by the four CPV cells 58 is rotationally offset by 45-degrees from the larger square substrate relative to a reference axis centrally and perpendicularly intersecting the substrate 56. Accordingly, each CPV cell resides approximately midway along a respective one of the substrate's four perimeter edges, at a short distance spaced inward therefrom. The substrate 56 may be a DBC single alumina ceramic carrier, and the CPV cells may be C4MJ fourth generation triple junction solar cells. For more detail on usable quad-cell CPV power module design, reference may be made to the aforementioned AIP publication incorporated herein.

Referring again to FIGS. 5 and 6, each CPV power module 54 is mounted atop a respective heat exchanger block 60 through which a cooling fluid (e.g. water/glycol mixture) is circulated to cool the CPV power module 54 in the assembled and operating state of the finished HCPV-T module 10. Preferably, the HCPV-T module 10 is used in a combined power and heating (CPH) application, where the heated cooling fluid is put to good use, for example for heat exchange with a hot water tank, for purposes such as floor heating, ambient heating, or other hot water applications. Each heat exchanger block 60 is mounted within the support basin 18 atop the floor 28 at a respective spot centered between four of the basin protrusions 32A, 32C, and thus aligned beneath a respective optical support seat 36 of the optical support tray 34, and thus likewise aligned beneath the respective optical assembly 40 installed in that support seat 36. So, each heat exchanger block 60 and the respective CPV power module 54 installed thereon resides in alignment with a respective spot in the three-by-three grid of optical assemblies 40, in a corresponding spot between the grid rows of the arrayed basin protrusions 32A-32C.

Figure 16:
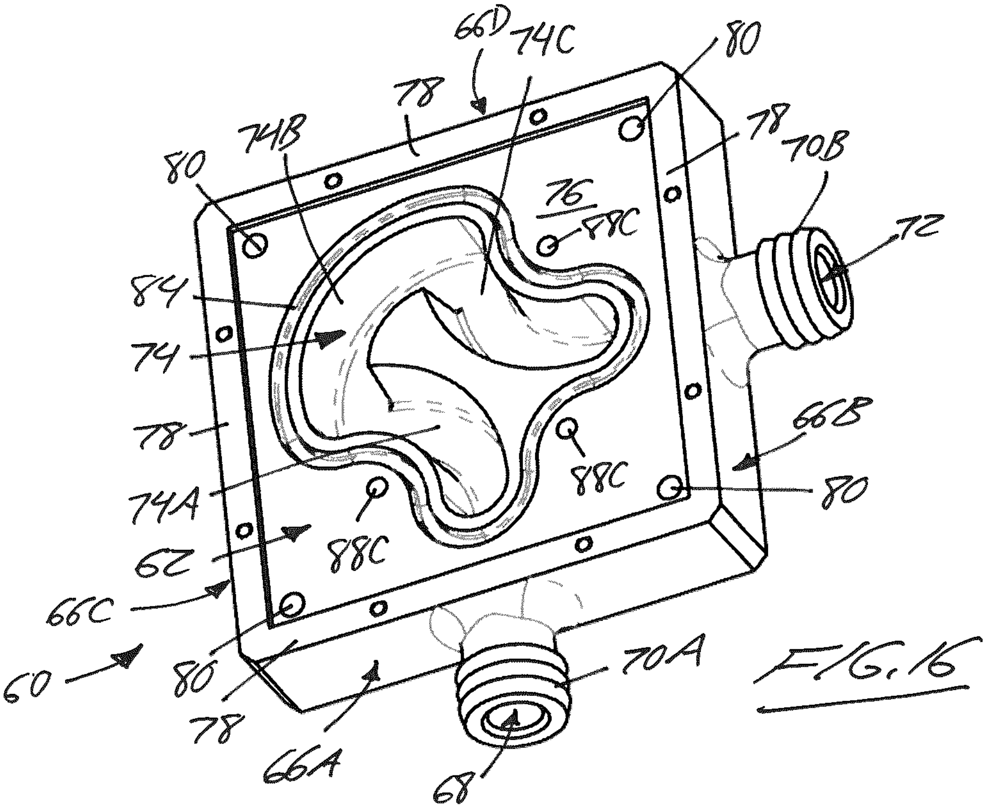
FIG. 16 is a perspective view of a heat exchanger block of the electrical/thermal subassembly of FIG. 5, as viewed from a top working face thereof to which the quad-cell CPV power module of FIG. 11 is mountable for liquid cooling thereof.
Figure 17:
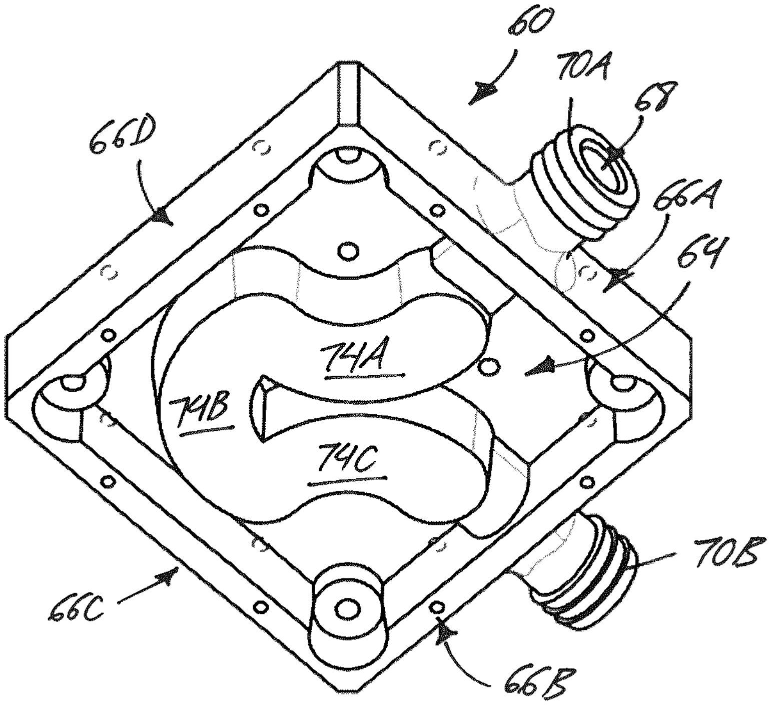
FIG. 17 is another perspective view of the heat exchanger block of FIG. 16, but from an opposing bottom thereof that during assembly of the HCPV-T module of FIG. 1 is mounted to a floor of the support basin subassembly of FIG. 4.

Turning to FIGS. 16 and 17, an isolated one of the heat exchanger blocks 60 is shown therein. The block 60 has a top working face 62 (FIG. 16) of square shape in plan view, an opposing bottom 64 (FIG. 17) whose outer perimeter is of equal or similarly sized square shape in plan view, and four outer sides 66A-66D spanning peripherally around the square shapes of the top working face 62 and opposing square bottom 64. The first outer side 66A of the block 60 has an inlet port 68 that opens into the block 60 from an exterior thereof, and is surrounded by a respective coupling neck 70A that projects externally from the first outer side 66A of the block to enable connection of a flexible hose thereto to serve as a connection conduit through which the cooling fluid can enter the block 60 during pumped fluid circulation during use of the finished HCPV-T module 10. A second outer side 66B of the block 60 resides in neighbouring relation to the first outer side 66A, and features an outlet port 72 through which the cooling liquid fed into the block 60 via the inlet port 68 can subsequently exit the block 60. Like the inlet port 68, the outlet port 72 is surrounded by a respective coupling neck 70B that projects externally from the second outer side 66B of the block to enable connection of a flexible hose thereto to again serve as a connection conduit, this time through which the cooling fluid can be discharged from the block during pumped fluid circulation during use of the finished HCPV-T module 10.

The two coupling necks 70A, 70B may be uniquely referred to herein as inlet neck 70A and outlet neck 70B according to the naming convention of the respective ports 68, 72 passing therethrough. The inlet and outlet ports 68, 72 each reside at a midway point along the respective outer side 66A, 66B of the block. As used herein, the third outer side 66C of the block refers to the side thereof that resides oppositely of the second outer side 66B, and the fourth outer side 66D of the block refers to the final side thereof that resides oppositely of the first outer side 66A.

The block 60 has formed therein a predefined flow channel 74 of fixed shape following a non-linear path that fluidly interconnects the inlet and outlet ports 68, 72 to one another, thereby enabling flow of the cooling fluid therebetween during pumped fluid circulation through the block in the finished HCPV-T module 10. The non-linear path of the flow channel 74 is specifically designed so that the cooling fluid pumped therethrough will pass serially by the locations of all four of the CPV cells 58 on the respective CPV power module 54 installed on the block 60. This way, the cooling fluid is specifically routed in targeted fashion past the most concentrated hot spots of the CPV module 54, i.e. the CPV cells 58 onto which the concentrated sun light is specifically focussed by the four CPCs 48 of the quad concentrator 46. The top working face 62 of the block is has a flat central receiving area 76 of square outer perimeter that occupies a majority of the top working face 62, the remainder of which is occupied by a slightly raised outer rim 78 that surrounds the central receiving area 76 on all four sides thereof. The flow channel 74 is recessed into the central receiving area 76 of the block's top working face 62, and the flow channel's non-linear path between the inlet and outlet ports 68, 72 is composed of three arcuately curved segments 74A-74C.

The first arcuate segment 74A has a starting point at its connection to the inlet port 68 at a location just inside the outer rim 78 near the first outer side 66A of the block at a halfway distance therealong. The first segment 74A arcs to a respective end point thereof just inside the outer rim 78 near the third outer side 66C of the block at a halfway distance therealong. This end point of the first segment 74A thus resides straight across from the outlet port 72 of the block 60. The arcuate curvature of the first segment 74A is such that its concave side faces outwardly toward the corner of the block where the first and third outer sides 66A, 66C intersect, while its convex side faces toward the third segment 76C that lies oppositely of the first segment across a center point of the block in mirrored relation to the first segment across an imaginary diagonal line of the block. From the end point of the first arcuate segment 74A, which also denotes the start point of the second arcuate segment 74B, the second arcuate segment arcs to its respective end point just inside the outer rim 78 near the fourth side 66D of the block at a halfway distance therealong. The arcuate curvature of the second segment 74B is such that its convex side faces outwardly toward the corner of the block where the third and fourth sides 66C, 66D intersect. From the end point of the second arcuate segment 74B, which also denotes the start point of the third arcuate segment 74C, the third arcuate segment 74C arcs to its respective end point just inside the outer rim 78 near the second side 66B of the block at a halfway distance therealong. The arcuate curvature of the third segment 74B is such that its concave side faces outwardly toward the corner of the block where the second and fourth sides 66B, 66D intersect, while its convex side faces toward the convex side of the first segment 74A in mirrored symmetric relation thereto across the imaginary diagonal line of the block mentioned earlier. At its respective end point, the third segment 74C connects to the outlet port 72 of the block 60.

The square receiving area 76 of the block's top working face has four fastening holes 80 therein near the outer corners thereof, just inside the outer rim 78. These holes enable mounting of a square plate of thermally conductive material, for example a copper plate 82, to the top working face 62 of the block 60 in a position occupying an entirety or substantial entirety of the receiving area 76. The mounted copper plate 82 thus fully covers the open topside of the recessed flow channel 74 in the process. To provide fluid-tight closure of the open topside of the recessed flow channel 74, a sealing groove 84 is also recessed into the receiving area 76 of the block 60 in fully surrounding fashion to the flow channel's open top, and a compressible seal 86 of matching shape to this sealing groove 84 is received therein. This can be seen in FIG. 6, where one of the heat exchanger blocks 60 is shown in exploded relation to its copper plate 82 and compressible seal 86, which is sandwiched between the block and plate during assembly to close off the open topside of the recessed flow channel 74 in fluid-tight fashion. As a result, when pumped through the heat exchanger block 60, the cooling fluid flows through the flow channel 74 in physical contact with the thermally conductive copper plate 82 at the topside of the flow channel 74.

The copper plate 82 has three mounting holes 88A therein (FIG. 6) in a layout of matching relationship to three corresponding mounting holes 88B in the shared substrate 56 of the CPV power module 54 (FIG. 15), and three more corresponding mounting holes 88C in the receiving area 76 of the top working face 62 of the heater exchanger block. Through alignment of these sets of mounting holes 88A-88C and feeding of suitable fasteners 110 therethrough in a manner described in more detail further below, the CPV power module 54 is fastened to the copper plate 82 and the underlying heat exchanger block 60 in a position placing the underside of the power module's shared substrate 56 flush against the copper plate 82. The layout of the mounting holes 88A-88C are such that the square shape of the power module substrate 56 aligns with both the square shape of the copper plate 82 and the underlying receiving area 76 of the heat exchanger block. As described earlier, each CPV cell 58 of the CPV power module 54 resides approximately midway along a respective one of the substrate's four perimeter edges, at a spaced distance inward therefrom. These CPV cell positions match the midway locations at which the start and end points of the three arcuate flow channel segments 74A-74C reside along the respective perimeter boundaries of the block's receiving area 76 at short distances inward from the outer rim 78 of the heat exchanger block 60.

Accordingly, in the cooling fluid's flow path from the start of the first flow channel segment 74A to the end of the third flow channel segment 74C, the cooling fluid flows serially past the locations of all four CPV cells 58 on the CPV power module 54 that is mounted atop the thermally conductive copper plate 82 of the heat exchanger block 60. This provides effective and efficient cooling of the CPV module 54 by directing the cooling fluid in targeted fashion particularly to these specific hot spots of the CPV power module 54. The plate 82 of copper or other thermally conductive material against which the CPV power module substrate 56 is flush mounted ensures optimal heat transfer therewith, while the remainder of the heat exchanger block 60 can be made of molded plastic or other cheaper and/or less heat conductive material than the conductive copper plate 82. The copper plate 82 serves as a strategically placed thermally conductive wall specifically at the topside of the channel where the CPV power module is mounted to optimize heat transfer between the cooling fluid moving through the flow channel and the CPV power module mounted to the heat exchanger block.

Referring to FIGS. 5 and 6, flexible hoses 90 or other connection conduits are connectable to the inlet and outlet ports 68, 72 of the heat exchanger blocks 60, for example using hose clamps 92 on the preferably barbed coupling necks 70A, 70B of the heat exchanger blocks 60. The hoses 90 and heat exchanger blocks 60 thereby forming an assembled heat exchanger circuit through which the cooling fluid is pumped serially through the heat exchanger blocks 60 to cool the respective CPV power modules 54 of all the optical assemblies 40 of the assembled HCPV-T module 10. To communicate this heat exchanger circuit with a pumping source outside the HCPV-T module 10, fluid introduction and fluid discharge ports 94A, 94B communicate the interior of the support basin 18 with the surrounding exterior environment outside the basin. In the illustrated embodiment, these fluid ports 94A, 94B do so through hollow interiors of one or more of the basin's freestanding protrusions 32A. Initial intake and final discharge hoses 90A, 90B are connected to suitable hose fittings at these introduction and discharge ports 94A, 94B, and are respectively run to the inlet port 68 of a first heat exchanger block of the circuit and the discharge port 72 of a final heat exchanger block of the circuit. Meanwhile, the other hoses 90 instead each connect the outlet port 72 of one heat exchanger block to the inlet port 68 of another heat exchanger block. As shown, the hoses 90 can include linear hoses for each passing between two adjacent freestanding basin protrusions 32A, and curved hoses for each curving around multiple sides of one of the freestanding basin protrusions 32A, wherever such variation in hose shape is necessary to span serially from one heat exchanger block of the circuit to another.

Figure 3:
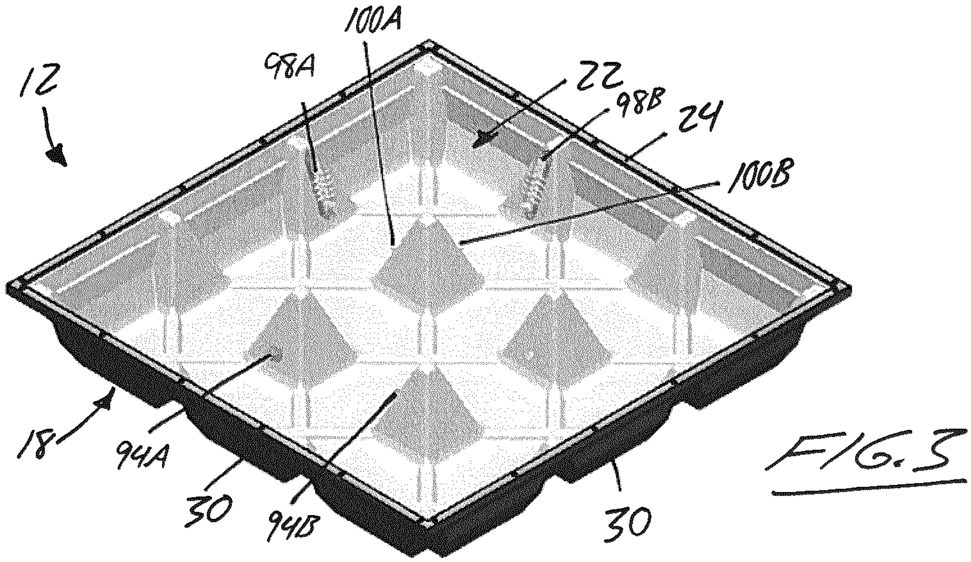
FIG. 3 is an isolated and assembled view of the support basin subassembly of FIG. 2.
Figure 4:
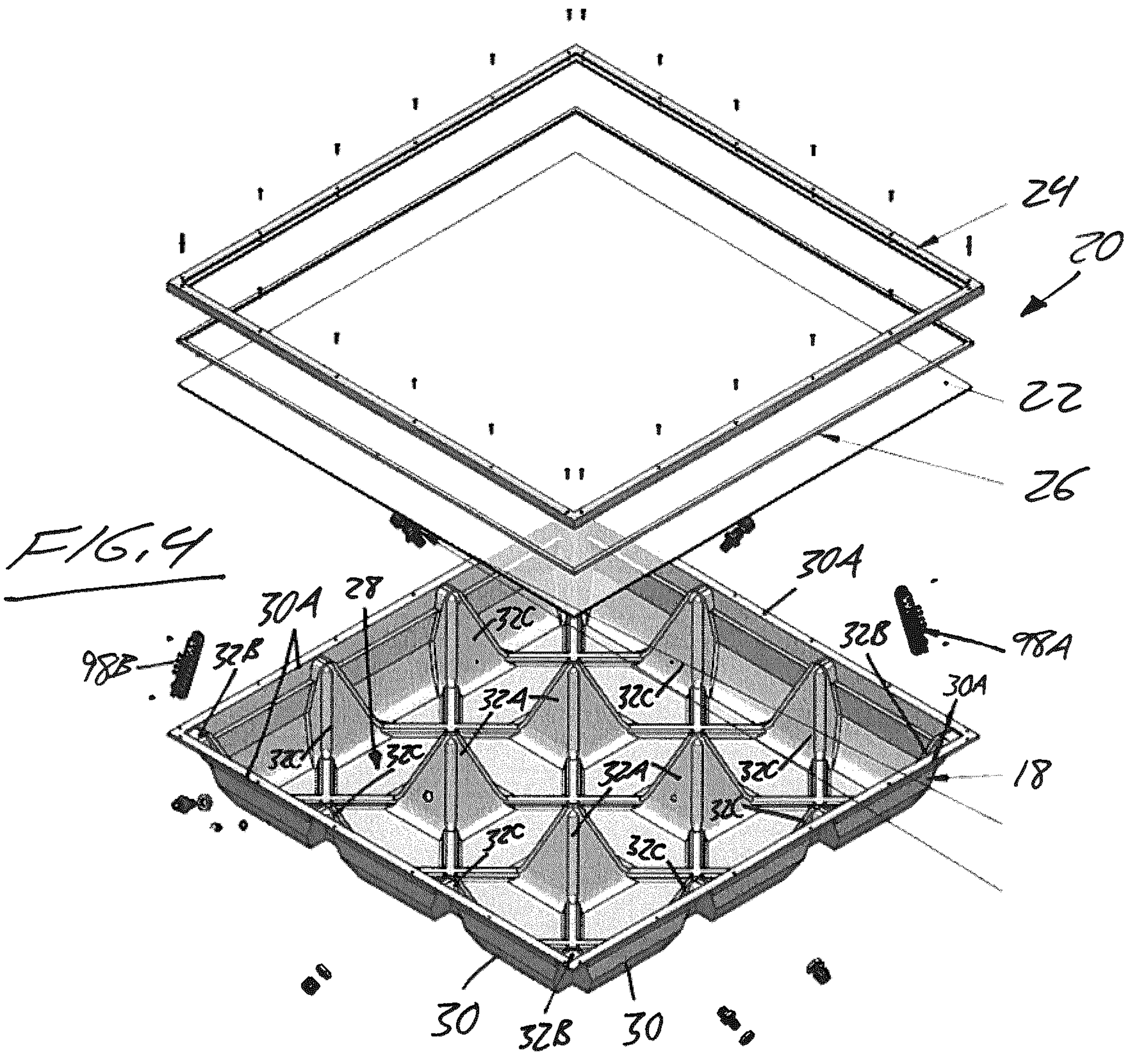
FIG. 4 is an exploded view of the support basin subassembly of FIG. 3.

The electrical/thermal subassembly 16 also includes wiring 96 for electrical connections to the CPV power modules 54, among which wires can be routed internally along the perimeter walls 30 of the basin, and to the CPV power modules 54 between the rows of basin protrusions 32A-32C. With reference to FIGS. 3 and 4, wiring terminals 98A, 98B for positive and negative wires can optionally be supported on one or more of the basin protrusions 32A-32C. In the illustrated example, the two wiring terminals 98A, 98B are each mounted on a respective mid-wall protrusion 32C of a different respective one of the basin's perimeter walls than the other, thus residing at locations directly and easily reachable by the wiring that is routed internally along the basin's perimeter walls 30. Like the fluid introduction and discharge ports 94A, 94B, one or more wiring ports, for example separate positive and negative wiring ports 100A, 100B, are provided to the basin interior to the surrounding exterior environment, and can optionally be located in one or more of the internally hollow freestanding basin protrusions 32A, as shown, to enable positive and negative lead wires 96A, 96B to connect the internal wiring terminals 98A, 98B to the external circuitry of the CHP solar system.

Figure 11:
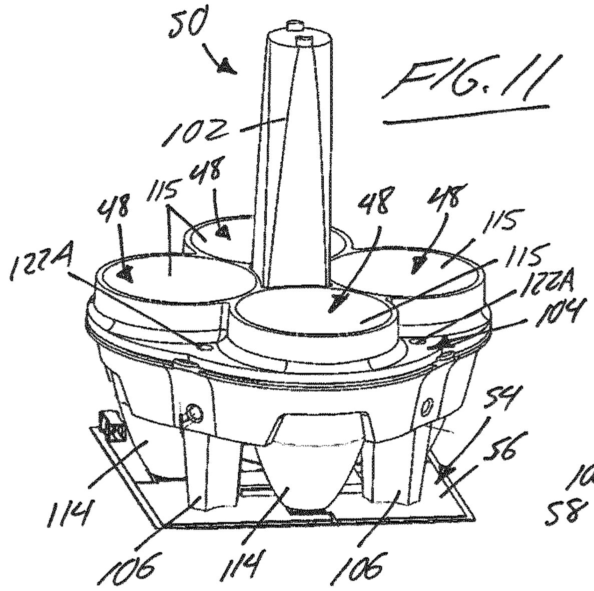
FIG. 11 is a perspective view of a CPC holder, a quad concentrator mounted thereon, and a quad-cell CPV power module atop which the CPC holder is mounted to carry the quad concentrator in a position aiming its four CPCs onto four CPV cells of the quad-cell CPV power module.
Figure 12:
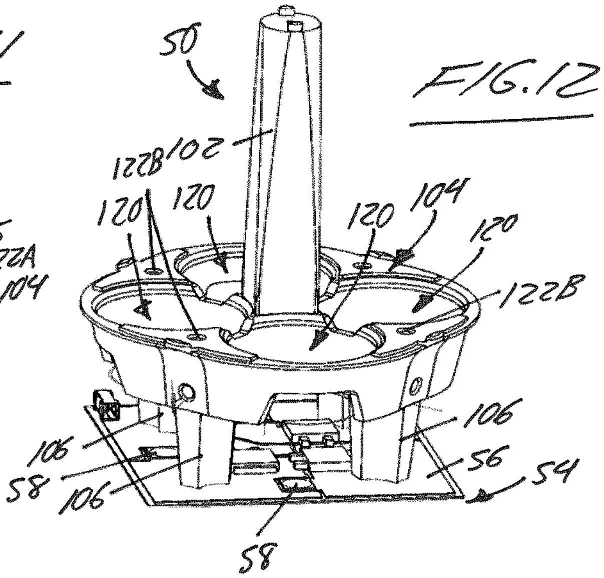
FIG. 12 is a perspective view the CPC holder and quad-cell power module of FIG. 11 with the quad concentrator thereof removed for illustrative purpose.

For holding the quad concentrator 46 of each optical assembly 40 in properly aligned relation over the respective CPV power module 54, use is made of the CPC holder 50 shown in FIGS. 11 and 12. The CPC holder 50 features a central upright post 102 surrounded on all sides by an annular support ledge 104, which in turn is supported atop a set of three support legs 106 that depend downwardly from an underside of the annular support ledge 104 at positions of equal angular spacing from one another around a central axis occupied by the central upright post 102. The central post 102 does not extend downwardly from the annular support ledge 104, and extends only upward therefrom. The bottom ends of the three legs 106 are received atop the substrate 56 of the CPV power module 54, specifically at locations overlying the aforementioned mounting holes 88B therein. The legs 106 thus also align with the corresponding mounting holes 88A in the copper plate, and of the additional corresponding mounting holes 88C of the heat exchanger block 60 that penetrate through the receiving area 76 of the block's top working face 62 into an open cavity in the bottom 62 of the block that exists between the recessed flow channel 74 and discrete perimeter walls of the block 60 that define the outer sides 66A-66D thereof. Through these three sets of aligned mounting holes 88A, 88B, 88C the CPC holder 50 is fastened to the heat exchanger block 60 using fasteners 110 (FIG. 6) that are fed from the bottom cavity of the heat exchanger block 60 upwardly through the copper plate 82 and overlying CPV power module substrate 56. These fasteners 110 thereby clamp the CPC holder 50, copper plate 82 and CPV power module 54 in place atop the heat exchanger block 60. Further securement of the copper plate 82 can be made using another set of four fasteners 112 (FIG. 6) engaged into the fastening holes 80 of the heat exchanger block 60 through corresponding fastening holes in the copper plate 82 near the corners thereof. The fastened-down legs 106 of the CPC holder 50 serve to support the ledge 104 of the CPC holder 50 in spaced overhead relation to the CPV power module 54 that's now mounted atop the heat exchanger block 60.

Figure 13:
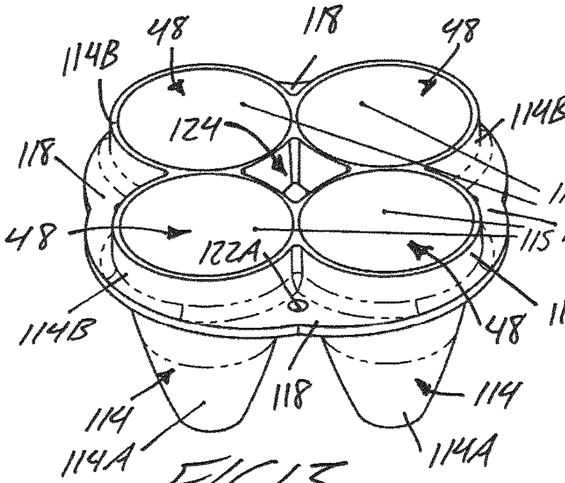
FIG. 13 is a top perspective view the quad concentrator of FIG. 11 in isolation.
Figure 14:
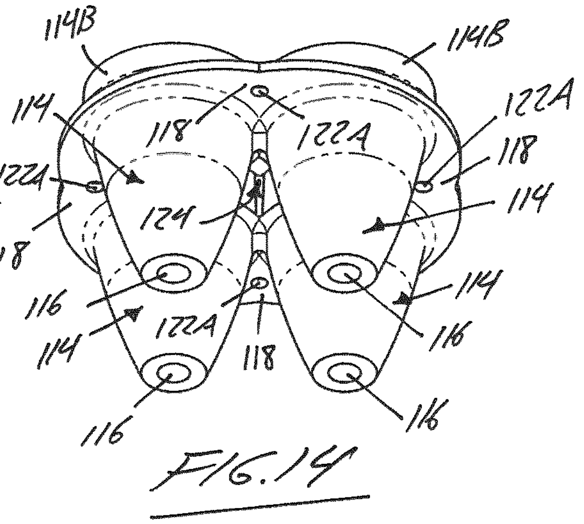
FIG. 14 is a bottom perspective view the quad concentrator of FIG. 13.

Referring again to FIGS. 11 and 12, the supportive ledge 104 of the CPC holder is used to support the four CPCs 48 of the quad concentrator 46, which is shown in isolation in FIGS. 13 and 14. The quad concentrator 46 is of a novel design integrating four CPCs 48 as seamlessly integral components of a singular unitary structure. Each CPC 48 has a respective cone-like exterior wall 114 whose interior surface delimits a parabolically contoured interior space 116 of the CPC, and has an off-axis paraboloidal relationship to a respective central axis around which the cone-like exterior wall 114 circumferentially spans. The central axes of the four CPCs are parallel to one another, and reside at four corners of an imaginary square in a reference plane normal to those parallel axes. This imaginary square matches the size of that whose corners are occupied by the CPV cells 58 on the substrate 56 of the CPV power module 54.

The quad concentrator's unitary structure features four joining webs 118, each of which spans between a respective adjacent pair of the four CPCs 48 at a discrete elevation on the exterior walls 114 thereof. This web-occupied elevation is nearer to a topmost plane of the quad concentrator 46 where the cone-like shape of each CPC 48 is at its widest to defined widened entrance aperture 115 of the CPC, than to a bottommost plane of the quad concentrator 46 where the cone-like shape of each CPC 48 is at its narrowest to define a narrowed exit aperture 116 of the CPC. The joining webs 118 in the illustrated example all reside at the same discrete axial elevation as one another in a common plane, and therefore not only interconnect the four CPCs 48, but also collectively define a planar support flange for resting flat atop the support ledge 104 of the CPC holder 50. Below the shared plane of the joining webs 118, hanging lower regions 114A of the walls 114 of the four CPCs hang independently of one another from the support flange, and reside in spaced apart and unattached relationship to one another. The support ledge 104 of the CPC holder 50 has four openings 120 penetrating axially therethrough for respective receipt therein of the of hanging lower portions of the four CPCs 48. This is shown in FIG. 11, where the webs 118 of the quad concentrator are seated atop the supportive ledge 104 of the CPC holder 50, and are fastened thereto via aligned holes 122A, 122B in the webs 118 and supportive ledge 104. The four CPCs 48 hang downwardly from the supportive ledge 104 through the openings 120 therein, thus placing the exit apertures 116 of the four CPCs directly over the four CPV cells 58 of the underlying CPV power module 54 on which the CPC holder is standing.

Above the support flange collectively defined by the joining webs 118, upper regions of the exterior walls 114 of each adjacent pair of CPCs are integrally, directly and seamlessly interjoined with one another at areas where the circular cross-sections of the walls 114 of the two CPCs have parallel tangent lines to one another. In the illustrated example, these upper regions 114B of the CPC walls 114 are interjoined over a full elevational span of this upper region, all the way from the shared common plane of the joining webs 118 to the shared common plane of the entrance apertures 115 at the top ends of the four CPCs 48. Between the joined-together upper regions 114B of the CPC walls 114, a central opening 124 penetrates axially through the quad concentrator 46, and is shaped to accommodate passage therethrough of the upright post 102 of the CPC holder 50, such that the upright post 102 stands upwardly from the quad concentrator 46 once seated and fastened on the supportive ledge 104. The upright posts 102 extends upwardly past the top ends of the four CPCs 48, as shown in FIG. 11.

Figure 9:
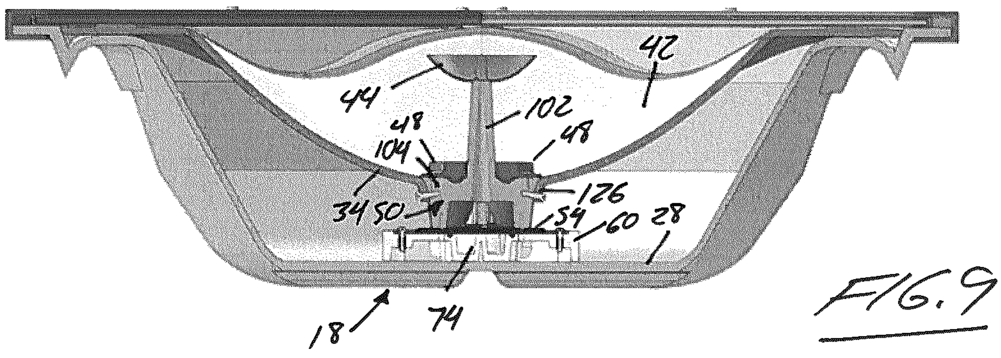
FIG. 9 is an elevational cross-sectional view of the HCPV-T solar collector module of FIG. 1, as viewed in a cutting plane denoted by line A-A thereof.
Figure 10:
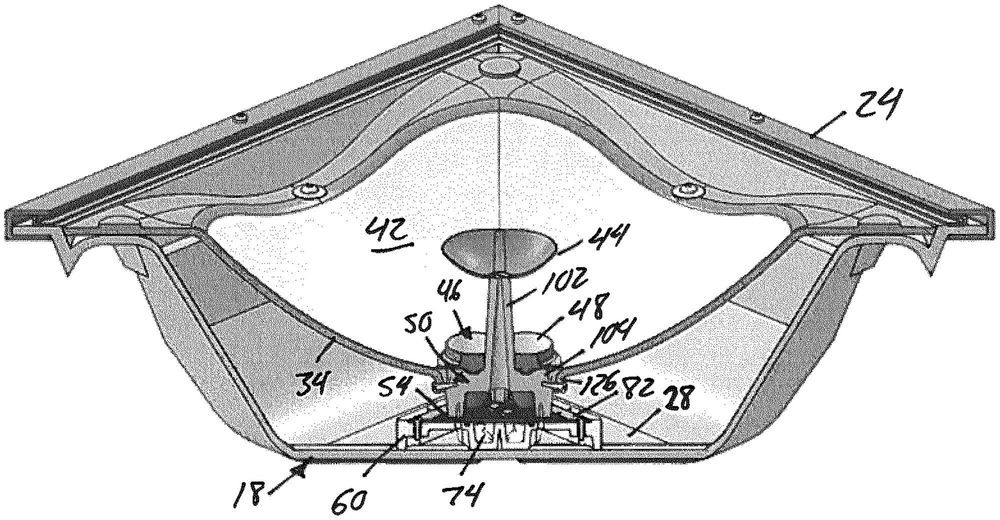
FIG. 10 is a perspective view of the same cross-section shown in FIG. 9.

FIGS. 9 and 10 illustrate the fully assembled and installed positions among the different subassembly components at one of the nine arrayed optical assemblies 40 of the finished HCPV-T module 10, particularly at a corner optical assembly installed at an outer corner of the basin 18, though similar installation likewise applies at non-corner locations of the arrayed optical assemblies 40. The upright post 102 of the CPC holder 50 stands upright through the central bottom opening 52A of the primary quad mirror 42 of the respective optical assembly 40, and in doing so likewise passes through a matching central bottom hole 52B (FIG. 8) in the respective optical seat 36 of the optical support tray 34. The upright post 102 thus resides on the central axis of the off-axis paraboloid shape of the primary quad mirror 42 of the optical assembly. As shown in FIGS. 9 and 10, the central bottom hole in the bottom of the optical support seat 36 may have a surrounding rim 126 of downwardly depending relationship from the rest of the support seat 36 for the purpose of fastening the optical support tray 34 to the outer periphery of the supportive ledge 104 of the CPC holder 50. The interjoined upper regions 114B of the four CPCs 48 are supported within the concave interior of the primary quad mirror 42, just above the central bottom opening 52A therein.

Here, the entrance apertures 115 of the four CPCs 48 open upwardly toward the underside of the secondary quad mirror 44, which is mounted atop the upright support post 102 in elevated relation above the four CPCs 48 of the quad concentrator 46. Incident sunlight shining on the primary quad mirror 42 through the cover glass 22 is reflected inwardly to the secondary quad mirror 44 supported atop the centrally located support post 102, and is then reflected downwardly from the secondary quad mirror 44 into the entrance apertures 115 of the four CPCs 48 of the quad concentrator 46, from which the concentrated sunlight is then emitted from the exit apertures 116 of the four CPCs 48 onto the four CPV cells 58 of the CPV power module 54 to generate electricity. Meanwhile, the resulting heat is transferred into the circulating cooling fluid that is pumped through the heat exchanger block 60 on a targeted flow path serially passing by each of the four CPV cells 58 in heat-exchange relationship therewith through the copper plate 82.

Since various modifications can be made in my invention as herein above described, and many apparently widely different embodiments of same made, it is intended that all matter contained in the accompanying specification shall be interpreted as illustrative only and not in a limiting sense.

The invention claimed is:

1. A high concentration photovoltaic-thermal (HCPV-T) module for electrical energy generation and thermal energy collection using concentrated light, said module comprising:

a basin comprising a floor, a plurality of perimeter walls upstanding from said floor around a perimeter thereof to bound an interior space of the basin, wherein said floor has a varying elevational profile characterized by an arrayed plurality of raised floor protrusions organized in one or more rows in which said raised floor protrusions are spaced apart from one another across intervening lower floor regions that are situated between, and are of lesser elevation than, said raised floor protrusions, and from which said raised floor protrusions are upstanding within the interior space at spaced apart positions from one another in said one or more rows;

a plurality of light-concentrating optical assemblies;

an optical support tray seated in an installed position within the interior space of said basin, and comprising an array of optical support seats concavely recessed into a topside of said optical support tray and laid out in multiple rows in a grid pattern thereon for individual support of a respective one of said light-concentrating optical assemblies in each of said optical support seats;

a plurality of concentrated photovoltaic (CPV) power modules in equal quantity to said plurality of light-concentrating optical assemblies, with each of said CPV power modules residing in aligned relation beneath a respective one of said light concentrating optical assemblies to receive concentrated light therefrom to generate electrical power; and a heat exchange assembly installed within the interior space of the basin and configured for routing of a cooling fluid in heat-exchange relation past each one of the CPV power modules;

wherein at least one row of the raised floor protrusions reside between the multiple rows of the optical support seats in the optical support tray and said optical support tray is seated atop said at least one row of the protrusions of the basin at rest points of the optical support tray that reside at positions adjacent outer corners of said support seats and between said multiple rows of the grid pattern in which said optical support seats are laid out, and said optical support seats hang downwardly between the raised floor protrusions in spaces between the raised floor protrusions.

2. The HCPV-T module of claim 1 wherein at least some of said raised floor protrusions of the basins are freestanding floor protrusions of inwardly spaced relation from said perimeter walls of the basin.

3. The HCPV-T module of claim 1 wherein the one or more rows of the raised floor protrusions comprise multiple rows, and at least some of said raised floor protrusions of the basin are embodied by indented areas of the perimeter walls.

4. The HCPV-T module of claim 1 wherein at least some of said support protrusions are of upwardly tapered shape, narrowing away from the floor of the basin.

5. The HCPV-T module of claim 4 wherein said upwardly tapered shape narrows in two dimensions of orthogonal relation to one another.

6. The HCPV-T module of claim 1 wherein at least one of said support protrusions has a fluid port therein through which said cooling fluid enters or exits said heat exchanger.

7. The HCPV-T module of claim 1 wherein at least one of said support protrusions also serves as a terminal support on which there is mounted a wiring terminal to which at least some of the CPV power modules are wired.

8. The HCPV-T module of claim 1 wherein said routing of the cooling fluid includes routing thereof between at least some of the raised floor protrusions at the intervening lower floor regions situated therebetween.

9. Componentry for a high concentration photovoltaic-thermal (HCPV-T) module for electrical energy generation and thermal energy collection using concentrated light, said componentry including:

one or more multi-cell concentrated photovoltaic (CPV) power modules each having multiple CPV cells mounted on a shared substrate in discrete positions thereon for respective alignment thereof with a plurality of compound paraboloid concentrators (CPCs); and one or more heat exchanger blocks for respective use with said one or more multi-cell CPV power modules, each heat exchanger block having a predefined flow channel delimited therein through which the cooling fluid is routed serially on a non-linear path past a plurality of the multiple CPV cells of a respective one of the multi-cell CPV power modules in heat exchange relation therewith;

wherein:

the non-linear path of the predefined flow channel comprises three arcuately curved segments that reside end-to-end with one another to join an inlet port on a first side of the heat exchanger block to an outlet port on a neighbouring second side of the heat exchanger block; and the three arcuately curved segments comprise a first segment that arcs from a connection with the inlet port near the first side of the heat exchanger block toward a third side thereof that resides opposite the second side, a second segment that arcs from the first segment toward a fourth side of the heat exchanger block that resides opposite the first side thereof, and a third segment that arcs from the second segment to a connection with the outlet port near the second side of the heat exchanger block, and wherein concave outer sides of the first and third segments face outwardly toward a perimeter of the heat exchanger block, convex inner sides of the first and third segments face inwardly toward one another, and a convex outer side of the second segment faces outwardly toward the perimeter of the heat exchanger block.

10. The componentry of claim 9 wherein said predefined flow channel of each heat exchanger block is a sole flow channel thereof that routes the cooling fluid serially past all of the CPV cells of the respective multi-cell CPV power module.

11. The componentry of claim 9 wherein said predefined flow channel of each heat exchanger block comprises a channel recessed into a face of the heat exchanger block, over which a thermally conductive plate is installed in fluid tight relation, whereby the cooling liquid flows through the channel in flowing contact with said thermally conductive plate.

12. The componentry of claim 11 wherein the shared substrate of the respective CPV power module is mounted against said thermally conductive plate, thereby establishing heat exchange relationship between the cooling fluid and the plurality of the multiple CPV cells through said thermally conductive plate.

13. A heat exchanger component for cooling a multi-cell concentrated photovoltaic (CPV) power module having a plurality of CPV cells discretely laid out on a shared substrate, said heat exchanger component comprising:

a block having an inlet port and an outlet port through which cooling fluid is flowable into and out of said block; and a predefined flow channel in said block that fluidly interconnects said inlet and outlet ports on a non-linear path;

wherein:

the non-linear path of the predefined flow channel passes serially by a plurality of discrete points that are distributed in spaced apart positions a face of the block in matching layout to respective locations of the CPV cells on the shared substrate of the multi-cell CPV power module;

the non-linear path of the predefined flow channel comprises three arcuately curved segments that reside end-to-end with one another to join an inlet port on a first side of the heat exchanger block to an outlet port on a neighbouring second side of the heat exchanger block; and the three arcuately curved segments comprise a first segment that arcs from a connection with the inlet port near the first side of the heat exchanger block toward a third side thereof that resides opposite the second side, a second segment that arcs from the first segment toward a fourth side of the heat exchanger block that resides opposite the first side thereof, and a third segment that arcs from the second segment to a connection with the outlet port near the second side of the heat exchanger block, and wherein concave outer sides of the first and third segments face outwardly toward a perimeter of the heat exchanger block, convex inner sides of the first and third segments face inwardly toward one another, and a convex outer side of the second segment faces outwardly toward the perimeter of the heat exchanger block.

14. The heat exchanger component of claim 13 comprising a wall of thermally conductive material that closes off said predefined flow channel in the block at the face thereof such that the cooling liquid flows through the channel in flowing contact with an interior side said thermally conductive wall, wherein the flow channel is recessed into the face of the block, and the wall of thermally conductive material is defined by a separate cover plate mounted to said block at said face thereof.

15. The heat exchanger component of claim 14 wherein said block and said separate cover plate are materially distinct from one another.

16. A high concentration photovoltaic-thermal (HCPV-T) module for electrical energy generation and thermal energy collection using concentrated light, said module comprising:

a basin comprising a floor, a plurality of perimeter walls upstanding from said floor around a perimeter thereof, an interior space bound between said perimeter walls over said floor, a plurality of support protrusions upstanding from said floor within the interior space at spaced apart positions from one another;

a plurality of light-concentrating optical assemblies;

an optical support tray seated in an installed position within the interior space of said basin, and comprising an array of optical support seats concavely recessed into a topside of said optical support tray and laid out in a grid pattern thereon for individual support of a respective one of said light-concentrating optical assemblies in each of said optical support seats;

a plurality of concentrated photovoltaic (CPV) power modules in equal quantity to said plurality of light-concentrating optical assemblies, with each of said CPV power modules residing in aligned relation beneath a respective one of said light concentrating optical assemblies to receive concentrated light therefrom to generate electrical power; and a heat exchange assembly installed within the interior space of the basin and configured for routing of a cooling fluid in heat-exchange relation past each one of the CPV power modules;

wherein:

said optical support tray is seated atop the protrusions of the basin at rest points of the optical support tray that reside at position between adjacent rows of the grid pattern in which said optical support seats are laid out; and among the support protrusions, characterization of one or more thereof by at least one of:

(a) a fluid port in at least one of the support protrusions through which said cooling fluid enters or exits said heat exchanger; and/or (b) use of at least one of the support protrusions as a mounting location for one or more circuitry components to which at least a subset of the CPV power modules are wired.

17. The HCPV-T module of claim 16 wherein said one or more of the support protrusions are characterized by at least (a).

18. The HCPV-T module of claim 16 wherein said one or more of the support protrusions are characterized by at least (b).

19. The HCPV-T module of claim 18 wherein said one or more circuitry components comprise at least one wiring terminal.

20. A high concentration photovoltaic-thermal (HCPV-T) module for electrical energy generation and thermal energy collection using concentrated light, said module comprising:

a basin comprising a floor, a plurality of perimeter walls upstanding from said floor around a perimeter thereof, an interior space bound between said perimeter walls over said floor, a plurality of support protrusions upstanding from said floor within the interior space at spaced apart positions from one another;

a plurality of light-concentrating optical assemblies;

an optical support tray seated in an installed position within the interior space of said basin, and comprising an array of optical support seats concavely recessed into a topside of said optical support tray and laid out in a grid pattern thereon for individual support of a respective one of said light-concentrating optical assemblies in each of said optical support seats;

a plurality of concentrated photovoltaic (CPV) power modules in equal quantity to said plurality of light-concentrating optical assemblies, with each of said CPV power modules residing in aligned relation beneath a respective one of said light concentrating optical assemblies to receive concentrated light therefrom to generate electrical power; and a heat exchange assembly installed within the interior space of the basin and configured for routing of a cooling fluid in heat-exchange relation past each one of the CPV power modules;

wherein said optical support tray is seated atop the protrusions of the basin at rest points of the optical support tray that reside at position between adjacent rows of the grid pattern in which said optical support seats are laid out, and the heat exchange assembly comprises a plurality of heat exchanger blocks each corresponding to, and placed in heat exchange relation with, a respective one of the CPV power modules, and flexible hoses connected between said heat exchanger blocks for routing of the cooling fluid therebetween, and among which at least a subset of said flexible hoses pass between neighbouring pairs of the support protrusions, and/or span at least partially around at least one of the protrusions.

* * * * *